United States Patent
Rogers

(10) Patent No.: US 11,482,775 B2
(45) Date of Patent: Oct. 25, 2022

(54) ANTENNA ASSEMBLIES HAVING ENERGY DISSIPATION MECHANISMS

(71) Applicant: THE BOEING COMPANY, Chicago, IL (US)

(72) Inventor: John E. Rogers, Huntsville, AL (US)

(73) Assignee: THE BOEING COMPANY

( * ) Notice: Subject to any disclaimer, the term of this patent is extended or adjusted under 35 U.S.C. 154(b) by 424 days.

(21) Appl. No.: 16/564,222

(22) Filed: Sep. 9, 2019

(65) Prior Publication Data
US 2021/0075096 A1 Mar. 11, 2021

(51) Int. Cl.
| | | |
|---|---|---|
| H01Q 1/38 | (2006.01) | |
| H01Q 1/28 | (2006.01) | |
| H05K 1/02 | (2006.01) | |
| H01Q 13/10 | (2006.01) | |
| H01Q 1/42 | (2006.01) | |
| H01Q 21/00 | (2006.01) | |

(52) U.S. Cl.
CPC ............... *H01Q 1/38* (2013.01); *H01Q 1/28* (2013.01); *H01Q 1/42* (2013.01); *H01Q 13/106* (2013.01); *H01Q 21/0075* (2013.01); *H05K 1/0203* (2013.01)

(58) Field of Classification Search
CPC .......... H01Q 1/38; H01Q 1/28; H01Q 13/106; H01Q 1/42; H01Q 21/0075; H01Q 21/065; H01Q 3/26; H05K 1/0203; H05K 1/0207; H05K 1/0206; H05K 1/0243; H05K 3/4697; H05K 1/0259; H05K 2201/10098
See application file for complete search history.

(56) References Cited

U.S. PATENT DOCUMENTS

| | | | |
|---|---|---|---|
| 6,271,792 B1 * | 8/2001 | Sletten ............... | H01Q 21/0075 343/700 MS |
| 9,772,422 B2 | 9/2017 | Hull | |
| 2006/0001138 A1 * | 1/2006 | Sakama ................ | H05K 1/184 257/678 |
| 2015/0016078 A1 * | 1/2015 | Yang ....................... | C23C 28/40 361/762 |
| 2016/0054770 A1 * | 2/2016 | Bhardwaj ........... | H01M 50/209 361/679.54 |
| 2016/0329880 A1 * | 11/2016 | Gao ....................... | H01P 1/2039 |
| 2017/0033812 A1 * | 2/2017 | Son ....................... | H04B 1/0483 |
| 2017/0047641 A1 * | 2/2017 | Kim ....................... | H01Q 5/364 |
| 2018/0159203 A1 * | 6/2018 | Baks ..................... | H01Q 21/065 |
| 2018/0323490 A1 * | 11/2018 | Harp .................. | H01Q 21/0012 |
| 2020/0106192 A1 * | 4/2020 | Avser ....................... | H01Q 1/38 |

(Continued)

OTHER PUBLICATIONS

Fonseca, M. A., et al., "Flexible wireless passive pressure sensors for biomedical applications," Hilton Head 2006, Jun. 2006.

(Continued)

*Primary Examiner* — Alexander H Taningco
*Assistant Examiner* — Amy X Yang
(74) *Attorney, Agent, or Firm* — The Small Patent Law group LLC; Joseph M. Butscher

(57) ABSTRACT

An integrated antenna assembly includes one or more antenna elements, one or more electronics components, and one or both of a static discharge element disposed between the antenna element(s) and the electronics component(s) and/or one or more thermal dissipators.

23 Claims, 3 Drawing Sheets

(56) References Cited

U.S. PATENT DOCUMENTS

2020/0403584 A1* 12/2020 Varonen .................. H03F 3/19

OTHER PUBLICATIONS

Abad, E., et al., "Flexible tag microlab development: gas sensors integration in RFID flexible tags for food logistics," Sensors and Actuators B, Jul. 2007.

Rida, A., et al., "Conductive inkjet-printed antennas on flexible low-cost paper-based substrates for RFID and WSN applications," IEEE Antennas and Propagation Magazine, Jun. 2009.

Schwerdt, H. N., et al., "A fully passive wireless microsystem for recording of neuropotentials using RF backscattering methods," Journal of Microelectromechanical Systems, Aug. 2011.

Rose, D. P., et al., "Adhesive RFID sensor patch for monitoring of sweat electrolytes," IEEE Transactions on Biomedical Engineering, Jun. 2015.

Bito, J., et al., "Ambient RF energy harvesting from a two-way talk radio for flexible wearable wireless sensor devices utilizing inkjet printing technologies," IEEE Transactions on Microwave Theory and Techniques, Dec. 2015.

Escobedo, P., et al., "Flexible passive near field communication tag for multigas sensing," Analytical Chemistry, Dec. 2016.

Xu, G., et al., "Passive and wireless near field communication tag sensors for biochemical sensing with smartphone," Sensors and Actuators B, Feb. 2017.

Pozar, D.M., "Microstrip antenna aperture-coupled to a microstrip line," Electronics Letters, Jan. 1985.

Pozar, D.M., Kaufman, B., "Increasing the bandwidth of a microstrip antenna by proximity coupling," Electronics Letters, Apr. 1987.

Hallil, H., et al., "Feasibility of wireless gas detection with an FMCW Radar interrogation of passive RF gas sensor," IEEE Sensors, Nov. 2010.

Iwasaki, H., "A circularly polarized small-size microstrip antenna with a cross slot," IEEE Transactions on Antennas and Propagation, Oct. 1996.

Papapolymerou, I., et al., "Micromachined patch antennas," IEEE Transactions on Antennas and Propagation, Feb. 1998.

Gauthier, G.P., et al., "A 94 GHz aperture-coupled micromachined microstrip antenna," IEEE Transactions on Antennas and Propagation, Dec. 1999.

Cook, B.S., et al., "Multilayer inkjet printing of millimeter-wave proximity-fed patch arrays on flexible substrates," IEEE Antennas and Wireless Propagation Letters, Oct. 2013.

Sorkherizi, M.S., et al., "Planar high-efficiency antenna array using new printed ridge gap waveguide technology," IEEE Transactions on Antennas and Propagation, Jul. 2017.

Yi, X., et al., "Passive wireless smart-skin sensor using RFID-based folded patch antennas," International Journal of Smart and Nano Materials, Mar. 2011.

Zhang, N., et al., "Temperature sensor based on 4H-silicon carbide on diode operational from 20C to 600C," Applied Physics Letters, Feb. 2014.

Rogers, J.E., et al., "A passive wireless microelectromechanical pressure sensor for harsh environments," Journal of Microelectromechanical Systems, Feb. 2018.

Pozar, Voda, "A rigorous analysis of a microstripline fed path antenna," IEEE Transations on Antennas and Propagation, Dec. 1987.

Davidovitz, M., Lo, Y.T. "Rigorous analysis of a circular patch antenna excited by a microstrip transmission line," IEEE Transactions on Antennas and Propagation, Aug. 1989.

Patterson, C.E., et al. "A lightweight X-band organic antenna array with integrated SiGe amplifier," IEEE Radio and Wireless Symposium 2010, Jan. 2010.

Patterson, C.E., et al. "Implementation of a low cost, lightweight X-band antenna with integrated SiGe RF electronics," IEEE Geoscience and Remote Sensing Symposium 2010, Jul. 2010.

Morcillo, C.A.D., et al. "An ultra-thin, high-power, and multilayer organic antenna array with T/R functionality in the X-band," IEEE Transactions on Microwave Theory and Techniques, Dec. 2012.

Stephen Horst, et al., "Beam-Shaping of Planar Array Antennas Using Integrated Attenuators", 2007 Electronic Components and Technology Conference, pp. 165-168.

* cited by examiner

ANTENNA ASSEMBLIES HAVING ENERGY DISSIPATION MECHANISMS

FIELD OF EMBODIMENTS OF THE DISCLOSURE

Embodiments of the present disclosure generally relate to antenna assemblies, and more particularly, to antenna assemblies that are configured to dissipate energy, such as static charge and heat.

BACKGROUND OF THE DISCLOSURE

An antenna typically includes an array of conductors electrically connected to an electronic receiver or a transmitter. An electronic transmitter provides a time-varying voltage to terminals of the antenna, which, in response, radiates electromagnetic radio waves at a frequency corresponding to the time-varying voltage. Alternatively, as radio waves are received by the antenna, a time-varying voltage corresponding to the frequency of the radio wave is generated at the terminals, which, in turn is provided to the electronic receiver. Various types of known passive antennas are configured to transmit and receive radio waves with such a reciprocal behavior.

In some aerospace applications, there is a need for antennas that are capable of being positioned on conformal or non-planar surfaces, such as wings and fuselages of aircraft. Small aircraft, such as unmanned aerial vehicles (UAVs) or drones, in particular, have surfaces with low radii of curvature. Such aircraft typically need light weight antennas with low aerodynamic drag and low visibility. Further, various surfaces of aircraft may be formed from conductive or carbon fiber materials, which are known to change the electrical behavior of antennas, such as monopole and dipole antennas and derivatives (for example, whip, blade, Yagi, and other such antennas).

During flight of an aircraft, static charge typically builds up on external surfaces due to air friction. As such, the static charge may potentially undesirably affect the electronics of the integrated antenna assemblies.

Further, known integrated antenna assemblies having antenna arrays and integrated electronics such as transmit electronics dissipate heat through electrical vias to ground planes, which are limited in spreading heat from power sources (for example, power amplifiers). That is, certain electronics of known integrated antenna assemblies may generate heat. However, the generated heat may not be evenly and effectively spread out through the integrated antenna assemblies, which may potentially affect one or more components.

SUMMARY OF THE DISCLOSURE

A need exists for an integrated assembly that is able to effectively dissipate energy, such as static charge and heat. A need exists for an integrated antenna assembly that is able to dissipate static charge that builds thereon during flight of an aircraft, for example. A need exists for an integrated antenna assembly that is able to effectively and evenly distribute and dissipate heat energy, such as may be generated by certain components, such as power amplifiers.

With those needs in mind, certain embodiments of the present disclosure provide an integrated antenna assembly that includes one or more antenna elements, one or more electronics components, and a static discharge element disposed between the antenna element(s) and the electronics component(s). In at least one embodiment, a microstrip feed network electrically couples the antenna element(s) to the electronic component(s). In at least one embodiment, the antenna element(s) are disposed on a first dielectric, and the microstrip feed network is disposed on a second dielectric, which may be separated from the first dielectric. Another dielectric may provide spacing from the antenna elements.

As an example, the static discharge element extends from the microstrip feed network. The static discharge element may be a quarter-wave shorted stub with a length of a quarter wavelength of the operating frequency of the antenna assembly.

In at least one embodiment, a composite substrate is common to the antenna element(s) and the electronics component(s). The composite substrate includes a ground plane on a backside. The static discharge element is electrically connected to the ground plane by a via.

In at least one embodiment, the integrated antenna assembly also includes one or more thermal dissipators, such as may be formed as thermal dissipation layers. The thermal dissipator(s) may be disposed on or within a composite substrate that is common to the antenna element(s) and the electronics component(s). The thermal dissipator(s) may extend over an entire length and an entire width of the composite substrate.

In at least one embodiment, the thermal dissipator(s) are thermally-conductive films. The thermal dissipator(s) may be formed of, for example, one or more of graphite, graphene, alumina, silicon carbide, or aluminum nitride.

Each of the thermal dissipator(s) may be sandwiched between two ground planes. One or both of the two ground planes may electrically connect to at least one other ground plane through one or more vias.

Certain embodiments of the present disclosure provide an integrated antenna assembly that includes one or more antenna elements, one or more electronics components, and one or more thermal dissipators.

Certain embodiments of the present disclosure provide an integrated antenna assembly including a composite substrate having a first dielectric, a second dielectric separated from the first dielectric, and a ground plane on a backside. One or more antenna elements are disposed on the first dielectric. One or more electronics components are disposed on or within the composite substrate. A microstrip feed network is disposed on the second dielectric. The microstrip feed network couples the antenna element(s) to the electronic component(s). A static discharge element extends from the microstrip feed network and is disposed between the antenna element(s) and the electronics component(s). A first via electrically connects the static discharge element to the ground plane. One or more thermal dissipators are disposed within the composite substrate. Each of the thermal dissipators is sandwiched between two additional ground planes. One or both of the two additional ground planes electrically connect to the ground plane through one or more second vias.

DETAILED DESCRIPTION OF THE DISCLOSURE

Figure 1:
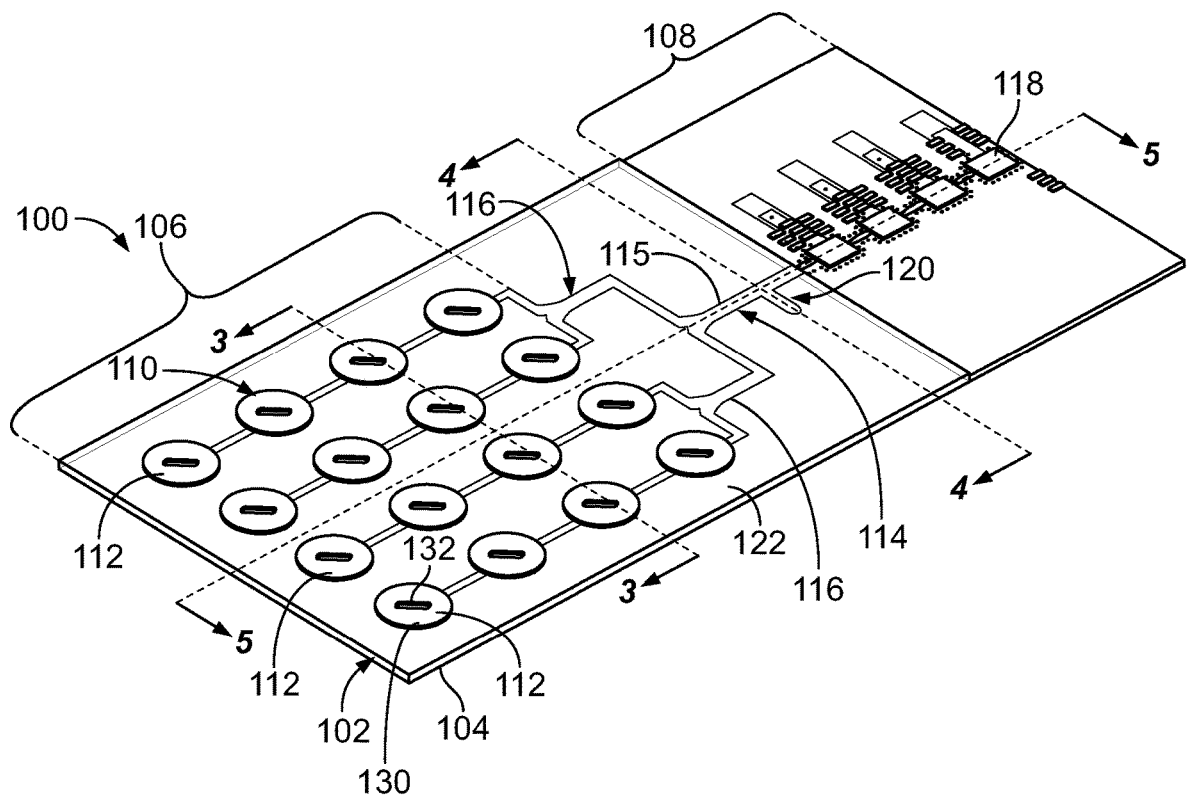
FIG. 1 illustrates a perspective top view of an integrated antenna assembly, according to an embodiment of the present disclosure.

The foregoing summary, as well as the following detailed description of certain embodiments, will be better understood when read in conjunction with the appended drawings. As used herein, an element or step recited in the singular and preceded by the word "a" or "an" should be understood as not necessarily excluding the plural of the elements or steps. Further, references to "one embodiment" are not intended to be interpreted as excluding the existence of additional embodiments that also incorporate the recited features. Moreover, unless explicitly stated to the contrary, embodiments "comprising" or "having" an element or a plurality of elements having a particular property may include additional elements not having that property.

Certain embodiments of the present disclosure provide an integrated antenna assembly having static discharge protection. The integrated antenna assembly includes an antenna array electrically connected to integrated electronics. The antenna array includes antenna elements, which may include an inclusive slot for decreasing the axial ratio of the antenna (i.e., decrease polarization loss). A microstrip feed network may be embedded in a radio frequency (RF) board (for example, a composite substrate). A static discharge element is electrically connected to the microstrip feed network. A ground plane is disposed on a backside of the composite substrate. The ground plane minimizes or, otherwise reduces, any change in the electrical behavior of the integrated antenna assembly due to the environmental surfaces.

The static discharge element is configured to prevent static charge from accumulating then discharging to the integrated electronics. In at least one embodiment, the static discharge element electrically connects to the microstrip feed network, which, in turn, electrically connects to the integrated electronics. The static discharge element electrically connects to a via, which electrically connects to the ground plane. As such, static charge that passes through the static discharge element discharges to the ground plane through the via, instead of passing to the integrated electronics and/or the antenna array.

The static discharge element is an integral portion of the integrated antenna assembly that diverts static charge to the ground plane. In at least one embodiment, the static discharge element is a quarter-wave shorted stub with a length of a quarter wavelength of the operating frequency of the antenna assembly. As such, the static discharge element passes signals near or at an operating frequency, while diverting accumulated static charge to the ground plane.

Certain embodiments of the present disclosure provide an integrated antenna assembly exhibiting improved thermal dissipation. The integrated antenna assembly includes one or more thermal dissipators (for example, thermal dissipation layers) between layers, such as dielectric layers. Each thermal dissipator may be a thermally-conductive film and/or printed layer extending between different dielectric layers of the integrated antenna assembly. In at least one embodiment, the thermally-conductive film is formed of graphite, graphene, alumina, silicon carbide, or aluminum nitride. The thermal dissipator effectively dissipates heat across the integrated antenna assembly. The thermal dissipator dissipates heat generated by a source (such as an electronic component, such as a power amplifier) to a ground plane, for example.

In at least one embodiment, an integrated antenna assembly includes a static discharge element and one or more thermal dissipators.

The integrated antenna assemblies may be manufactured using a combination of additive (for example, printing, film deposition, or the like) and subtractive (for example, wet etching, milling, laser etching, or the like) processes.

In at least one embodiment, the integrated antenna assemblies have a low cross-polarization and include one or more proximity-coupled antenna elements on a top surface of a composite substrate. An embedded microstrip feed network within the composite substrate may be proximity-coupled to the antenna elements. Optionally, the antenna elements may be edge-fed to the microstrip feed network. A ground plane on the backside of the composite substrate provides low loss signal propagation along the microstrip feed network.

FIG. 1 illustrates a perspective top view of an integrated antenna assembly 100, according to an embodiment of the present disclosure. The integrated antenna assembly 100 includes a composite substrate 102 that includes a plurality of layers, such as dielectrics, adhesives, and the like. A ground plane 104 is disposed on a backside of the composite substrate 102. For the sake of clarity, various layers of the composite substrate 102 are shown transparent in order to show internal components.

The integrated antenna assembly 100 includes an antenna portion 106 and an electronics portion 108 disposed on and/or within the composite substrate 102. That is, the antenna portion 106 and the electronics portion 108 are integrated onto and/or within the composite substrate 102. In at least one embodiment, the antenna portion 106 is not separated from the electronics portion 108. Instead, the antenna portion 106 and the electronics portion 108 share the composite substrate 102, which is common to both the antenna portion 106 and the electronics portion 108 (for example, the antenna portion 106 and the electronics portion 108 are on and/or within the composite substrate 102).

The antenna portion 106 includes an antenna array 110 including a plurality of antenna elements 112. The antenna portion 106 may include more or less antenna elements 112 than shown. A microstrip feed network 114 electrically couples to the antenna elements 112. The microstrip feed network 114 may include one or more power dividers 116 that are configured to distribute signals to the antenna elements 112.

The electronics portion 108 includes one or more electronics components 118. The electronics components 118 electrically connect to the microstrip feed network 114, such as through a grounded coplanar waveguide (GCPW) that electrically connects to the microstrip feed network 114.

The integrated antenna assembly 100 also includes a static discharge element 120 that electrically connects to the microstrip feed network 114. The static discharge element 120 is disposed on or within the composite substrate 102 between the antenna elements 112 and the electronics components 118. For example, the static discharge element 120 extends from a trace 115 of the microstrip feed network 114 that electrically connects the antenna portion 106 to the electronics portion 108.

In at least one embodiment, the antenna elements 112 are disposed on a first dielectric 122. The microstrip feed network 114 is embedded within the composite substrate 102 underneath the antenna elements 112. In this manner, the antenna elements 112 are proximity-coupled to the microstrip feed network 114. Alternatively, the antenna elements 112 and the microstrip feed network 114 may be on a common layer (such as a common dielectric layer), such that the antenna elements 112 are edge-fed in relation to the microstrip feed network 114.

As shown, the antenna array 110 may be a 4×4 array, having 16 antenna elements 112. Optionally, the antenna array 110 may include more or less antenna elements 112 than shown. For example, the antenna array 110 may be a 2×2 array having 4 antenna elements, an 8×8 array having 64 antenna elements, and so on.

The antenna elements 112 may include disk-shaped main bodies 130 with an interior inclusive slot 132 formed therein. Current travels along the microstrip feed network 114, then electrically couples to the antenna element 112 having the inclusive slot 132. The antenna elements 112 are circular, slotted antenna elements. The slot 132 of each antenna element 112 increases bandwidth and promotes circular polarization. That is, the slot 132 forces current to rotate around the antenna element 112. Alternatively, the antenna elements 112 may be sized and shaped differently than shown. For example, the antenna elements 112 may have a rectangular axial cross section. In at least one other embodiment, at least one of the antenna elements 112 may not include a slot 132.

Figure 2:
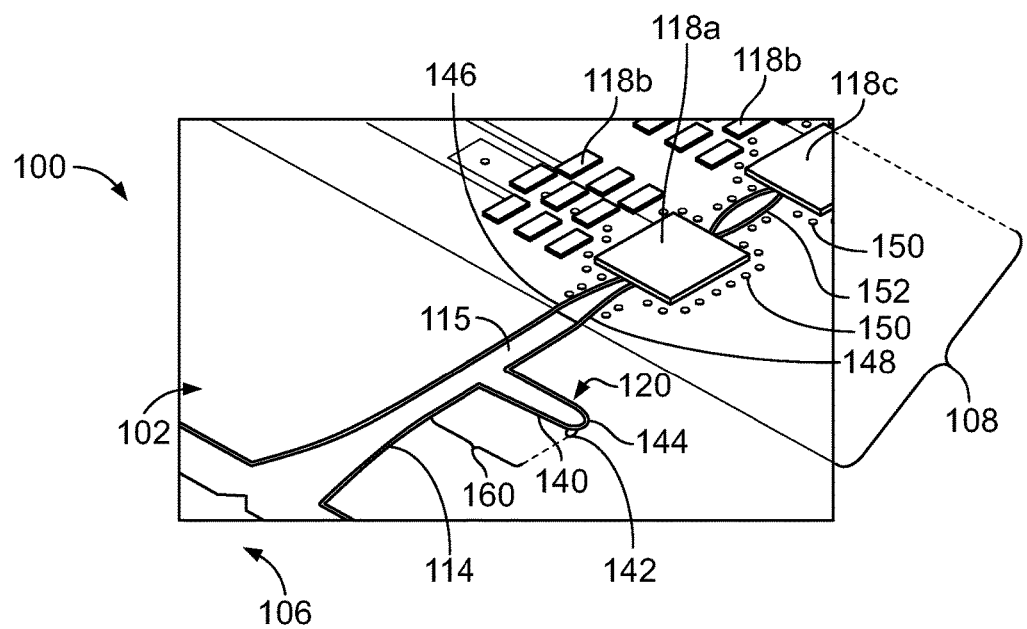
FIG. 2 illustrates a perspective top view of a static discharge element of the integrated antenna assembly.

FIG. 2 illustrates a perspective top view of the static discharge element 120 of the integrated antenna assembly. The static discharge element 120 extends from the microstrip feed network 114. In at least one embodiment, the static discharge element 120 is a trace 140 that electrically connects to the microstrip feed network 114, such as the trace 115 of the microstrip feed network 114 that electrically connects the antenna portion 106 to the electronics portion 108. As shown, the static discharge element 120 may electrically connect to the trace 115 at a right angle. Alternatively, the static discharge element 120 may extend from the trace at various other angles.

In at least one embodiment, the static discharge element 120 and the microstrip feed network 114 are disposed on a common layer, such as a common dielectric layer, of the composite substrate 102. A via 142 electrically connects to the static discharge element 120, such as at or proximate to a distal end 144 of the static discharge element 120. The via 142 electrically connects the static discharge element 120 to the ground plane 104 (shown in FIG. 1), which is below the static discharge element 120.

An end 146 of the trace 115 of the microstrip feed network 114 electrically connects to the electronics portion 108 through a GCPW 148. The GCPW 148, in turn, electrically connects to a first electronics component 118a. A plurality of vias 150 may extend around the first electronics component 118a. In at least one embodiment, the first electronics component 118a may be a low noise amplifier (LNA) in a quad flat no-leads (QFN) package. As another example, the first electronics component 118a may be a power amplifier.

The electronics portion 108 may also include a plurality of second electronics components 118b, such as capacitors. The first electronics component 118a may electrically connect to a third electronics component 118c, such as through a GCPW 152. The third electronic component 118c may be a another amplifier, for example.

The electronics portion 108 may include more or less electronics components 118 than shown. Further, the electronics components 118a and 118c may be other types of electronics components other than amplifiers. For example, the electronics components 118a and 118c may be mixers, filters, attenuators, other integrated circuits, processors, and/or the like. Also, the microstrip feed network 114 may directly electrically connect to one or more of the electronics components 118a and 118c, instead of through the GCPW 148.

Referring to FIGS. 1 and 2, the static discharge element 120 diverts static charge away from the antenna portion 106 and/or the electronics portion 108. For example, static charge that builds on the integrated assembly 100 that may pass into the microstrip feed network 114 is discharged into the static discharge element 120 before reaching the electronics components 118 and/or the antenna elements 112. The accumulated static charge discharges into the static discharge element 120, and then passes to the ground plane 104 through the via 142. As such, static charge that passes to the static discharge element 120 discharges to the ground plane 104 through the via 142, instead of passing to the integrated electronics components 118 and/or the antenna array 110.

The static discharge element 120 is an integral portion of the integrated antenna assembly 100 that diverts static charge to the ground plane 104. The static discharge element 120 is disposed on or within the composite substrate 102, which is common to both the antenna portion 106, which includes the antenna elements 112, and the electronics portion 108, which includes the electronics components 118.

In at least one embodiment, the static discharge element 120 is a quarter-wave shorted stub having a length 160 of a quarter wavelength of the operating frequency of the antenna assembly. Accordingly, the static discharge element 120 passes signals near or at an operating frequency, while diverting accumulated static charge to the ground plane 104. Alternatively, the static discharge element 120 may have a length that is shorter or longer than a quarter wavelength.

It has been found that an example of the integrated antenna assembly 100 including the static discharge element 120 exhibits an antenna gain that is similar to an integrated antenna assembly without a static discharge element. For example, in a 2×2 antenna array operating at or near 10 GHz, an integrated antenna assembly having a static discharge element 120 exhibits an antenna gain of ~9.5 dBi, as compared to an integrated antenna assembly without a static discharge element exhibiting an antenna gain of ~9.6 dBi. That is, the antenna gain of the two different integrated assemblies (one with a static discharge element 120, and one without) is nearly identical. In short, the static discharge element 120 has little to no effect on antenna performance. Alternatively, embodiments of the present disclosure may exhibit greater or less antenna gain.

In at least one embodiment, the integrated antenna assembly 100 shown in FIGS. 1 and 2 also includes one or more thermal dissipators (such as one or more thermal dissipation layers). For example, one or more thermal dissipators may be disposed between layers of the composite substrate 102. The thermal dissipator(s) distribute heat, such as may be generated by the electronics components 118, effectively and evenly to one or more ground planes, for example.

Figure 3:
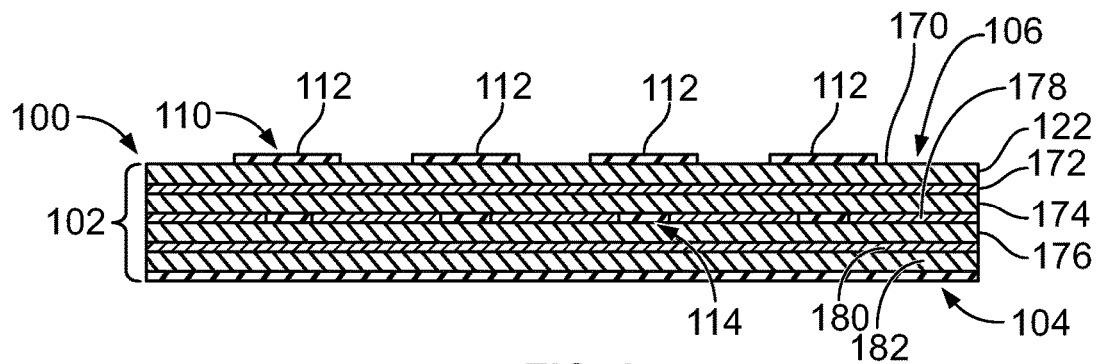
FIG. 3 illustrates a cross-sectional view of the integrated antenna assembly through line-3-3 of FIG. 1.

FIG. 3 illustrates a cross-sectional view of the integrated antenna assembly 100 through line-3-3 of FIG. 1. In at least one embodiment, the composite substrate 102 includes a plurality of dielectric layers. The antenna array 110 including the antenna elements 112 is disposed on the first (or top)

dielectric 122 of the composite substrate 102. The antenna elements 112 may be formed on an upper (for example, the top) surface 170 of the first dielectric 122, such as through a subtractive process (for example, laser etching, milling, or wet etching) or an additive process (for example, printing or film deposition). An adhesive layer 172 is sandwiched between the first dielectric 122 and a second dielectric 174. The second dielectric 174 is a spacer layer between the microstrip feed network 114 and the antenna elements 112.

The microstrip feed network 114 is formed on a third dielectric 176, such as through a subtractive process (for example, laser etching, milling, or wet etching) or an additive process (for example, printing or film deposition). An adhesive layer 178 may be sandwiched between the third dielectric 176 and the second dielectric 174. An adhesive layer 178 may be sandwiched between the third dielectric 176 and a fourth dielectric 182. The ground plane 104 is disposed on a backside of the fourth dielectric 182 and is distally located from the antenna elements 112. The ground plane 104 may be formed on the fourth dielectric 182 through a subtractive process (for example, laser etching, milling, or wet etching) or an additive process (for example, printing or film deposition)

Each dielectric layer of the composite substrate 102 may be separately formed. For example, the antenna elements 112 may be formed on the first dielectric 122 to form a first layer, the microstrip feed network 114 may be formed on the third dielectric 176, and the ground plane 104 may be formed on the fourth dielectric 182. The integrated antenna assembly 100 may or may not include the second dielectric 174, which forms a spacer layer. The various layers of the composite substrate 102 shown in FIG. 3 are then aligned and bonded together, such as through lamination with adhesive films (such as the adhesive layers 172, 178, and 180).

Figure 4:
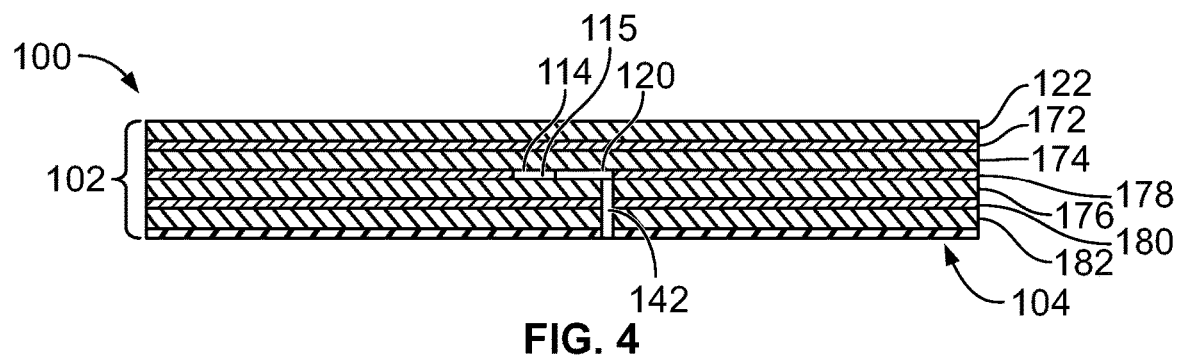
FIG. 4 illustrates a cross-sectional view of the integrated antenna assembly through line 4-4 of FIG. 1.

FIG. 4 illustrates a cross-sectional view of the integrated antenna assembly through line 4-4 of FIG. 1. The static discharge element 120 electrically connects to the microstrip feed network 114, and may be formed on the third dielectric 176, underneath the first dielectric 122, through a subtractive process (for example, laser etching, milling, or wet etching) or an additive process (for example, printing or film deposition). The static discharge element 120 electrically connects to the via 142, which extends through the third dielectric 176, the adhesive layer 180, and the fourth dielectric 182, thereby electrically connecting to the ground plane 104.

Figure 5:
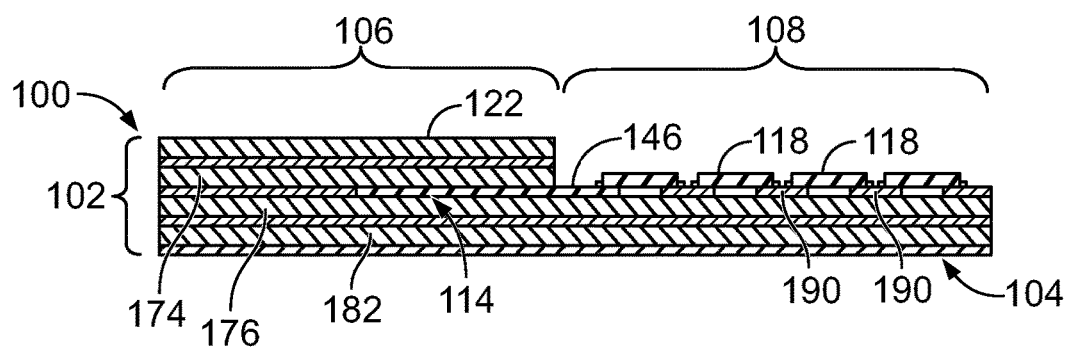
FIG. 5 illustrates a cross-sectional view of the integrated antenna assembly through line 5-5 of FIG. 1.

FIG. 5 illustrates a cross-sectional view of the integrated antenna assembly 100 through line 5-5 of FIG. 1. The electronics components 118 may be mounted on pads 190 formed on the third dielectric 176. The pads 190 may be formed through a subtractive process (for example, laser etching, milling, or wet etching) or an additive process (for example, printing or film deposition). The first dielectric 122 and the second dielectric 174 may or may not extend over the electronics components 118.

Figure 6:
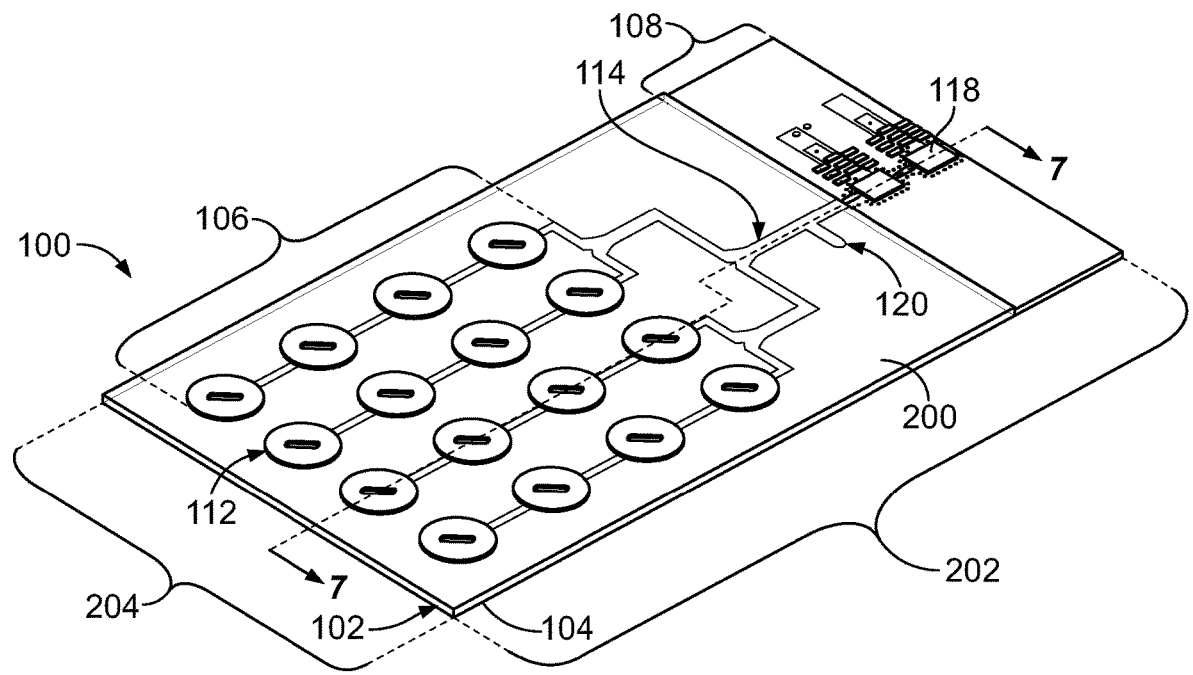
FIG. 6 illustrates a perspective top view of the integrated antenna assembly, according to an embodiment of the present disclosure.

FIG. 6 illustrates a perspective top view of the integrated antenna assembly 100, according to an embodiment of the present disclosure. The integrated antenna assembly 100 may be similar to the integrated antenna assembly 100 shown and described with respect to FIGS. 1-5. The integrated antenna assembly 100 includes an antenna portion 106 having antenna elements 112 and an electronics portion 108 having electronics components 118. The antenna portion 106 and the electronics portion 108 are on or within the composite substrate 102.

The integrated antenna assembly 100 includes one or more thermal dissipators 200 within the composite substrate 102. The thermal dissipators 200 may extend over an entire length 202 and an entire width 204 of the composite substrate 102. Optionally, the thermal dissipators 200 may extend over less than entire length 202 and/or entire width 204 of the composite substrate 102.

The integrated antenna assembly 100 may also include a static discharge element 120 extending from the microstrip feed network 114, as described above. Optionally, the integrated antenna assembly 100 may not include a static discharge element 120.

Figure 7:
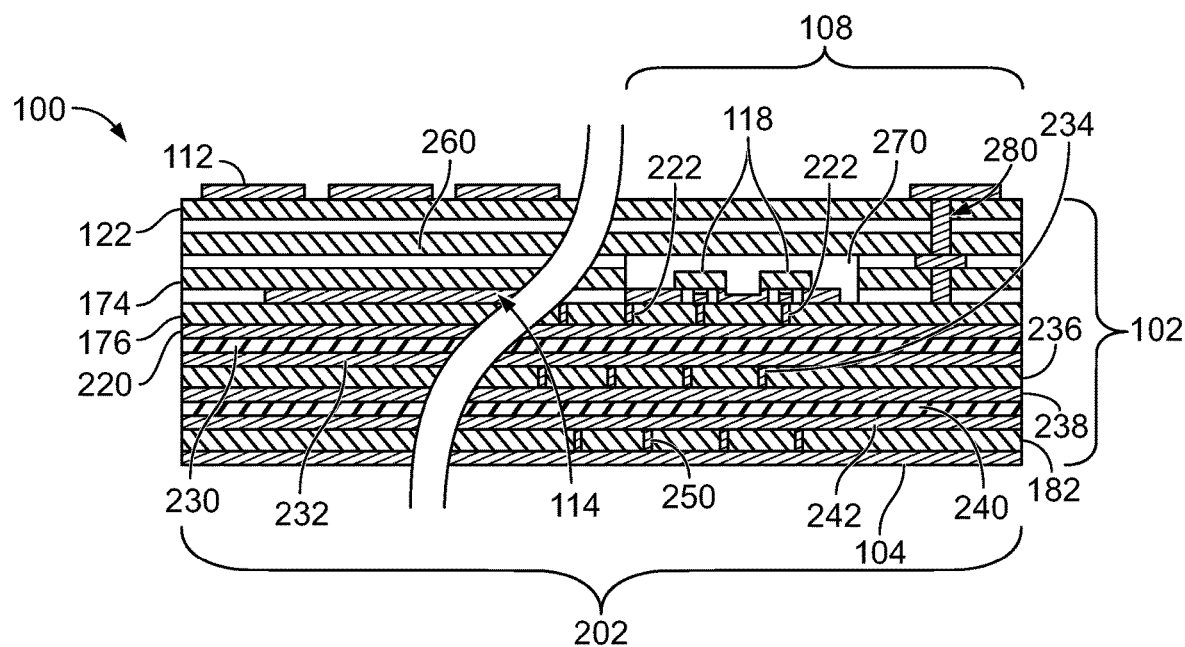
FIG. 7 illustrates a cross-sectional view of the integrated antenna assembly through line 7-7 of FIG. 6.

FIG. 7 illustrates a cross-sectional view of the integrated antenna assembly 100 through line 7-7 of FIG. 6. In this embodiment, a ground plane 220 may be formed on the dielectric 176 opposite from the microstrip feed network 114 and the electronics components 118. One or more vias 222 may extend through the dielectric 176 to the ground plane 220.

A first thermal dissipator 230 (such as a first thermal dissipation layer) is sandwiched between the ground plane 220 and a ground plane 232. As shown, the first thermal dissipator 230 may extend over the length 202 of the integrated antenna assembly 100.

Vias 234 may extend through the a dielectric 236 to a ground plane 238. A second thermal dissipator 240 (such as a second thermal dissipation layer) is sandwiched between the ground plane 238 and a ground plane 242. Vias 250 may extend through the dielectric 182 to the ground plane 104.

Each thermal dissipator 230 and 240 may be a thermally-conductive film and/or printed layer extending between different layers of the integrated antenna assembly 100. In at least one embodiment, the thermally-conductive film is formed of graphite, graphene, alumina, silicon carbide, or aluminum nitride. The thermal dissipators 230 and 240 effectively dissipate heat across the integrated antenna assembly 100. For example, heat generated by the electronics components 118 passes into the vias 222, passes into the ground plane 220, and is evenly spread into and through the thermal dissipator 230. Heat spread across the thermal dissipator 230 then passes into the thermal dissipator 240 and ultimately to the ground plane 104 through the vias 234 and 250, respectively. The thermal dissipators 230 and 240 dissipate heat generated by a source (such as the electronic component 118, such as a power amplifier) to the ground plane 104, for example.

As shown, an additional dielectric 260 may be disposed between the first dielectric 122 and the second dielectric 174. Further, the dielectrics 122 and 260 may extend over the electronics components 118, which may be disposed within a cavity 270. A printed interconnect 280 may also be formed in the electronics portion 108.

It has been found that an example of the integrated antenna assembly 100 shown in FIGS. 6 and 7 operating at or near 10 GHz exhibits an antenna gain of 15.5 dBi and a 3:1 axial ratio bandwidth of ~170 MHz. Optionally, embodiments of the present disclosure may exhibit greater or less antenna gain and greater or less bandwidth.

The integrated antenna assembly 100 may include more or less layers than shown. For example, the integrated antenna assembly 100 may include one thermal dissipator or more than two thermal dissipators. For example, referring to FIGS. 3-5, the composite substrate 102 may include a thermal dissipator beneath the dielectric 176. The thermal dissipator(s) may electrically connect to the ground plane 104 through vias, as shown in FIG. 7.

The various layers shown in FIG. 7 may be formed through subtractive and/or additive processes, as described above. The layers may be aligned and bonded together, as described above.

Referring to FIGS. 1-7, the microstrip feed network 114 may be electrically coupled to the ground plane 104, on a backside of the composite substrate 102, which provides for low loss signal propagation. Further, the ground plane 104 reduces the potential of change in the electrical behavior of the integrated antenna assembly 100, such as may be caused through conductive surfaces electrically connected to the integrated antenna assembly 100. The electronics components 118 may be disposed on the same layer as the microstrip feed network 114 to minimize or otherwise reduce signal loss and any noise. The integrated antenna assembly 100 includes one or both of the static discharge element 120 and/or one or more thermal dissipators 230 and/or 240, as described herein. The integrated antenna assembly 100 may be manufactured using a combination of additive (for example, printing and/or film deposition) and subtractive (for example, wet etching, milling, and/or laser etching) processes.

As described herein, in at least one embodiment, an integrated antenna assembly 100 includes one or more antenna elements 112, one or more electronics components 118, and a static discharge element 120 disposed between the antenna element(s) 112 and the electronics component(s) 118. In at least one embodiment, the integrated antenna assembly 100 also includes one or thermal dissipators 230 and/or 240, such as within a composite substrate 102, which is common to the antenna element(s) 112 and the electronics component(s) 118 (for example, the antenna element(s) 112, the electronics component(s) 118, and the thermal dissipator(s) 230 and/or 240 are on and/or within the composite substrate 102.

In at least one embodiment, the integrated antenna assembly 100 includes one or more antenna elements 112, one or more electronics components 118, and one or more thermal dissipators 230 and/or 240. The thermal dissipator(s) 230 and/or 240 may be within a composite substrate 102 that is common to the antenna element(s) 112 and the electronics component(s) 118.

Certain embodiments of the present disclosure provide a method of forming an integrated antenna assembly. The method includes providing one or more antenna elements, providing one or more electronics components, and disposing a static discharge element between the antenna element(s) and the electronics component(s). The method may also include providing one or more thermal dissipators. For example, the method may include disposing the thermal dissipator(s) within a composite substrate that is common to the antenna element(s) and the electronics component(s).

Certain embodiments of the present disclosure provide a method of forming an integrated antenna assembly. The method includes providing one or more antenna elements, providing one or more electronics components, and providing one or more thermal dissipators. Said providing steps may be on or within a composite substrate that is common to the antenna element(s), the electronics component(s), and the thermal dissipator(s).

As described herein, embodiments of the present disclosure provide an integrated assembly that is able to effectively dissipate energy, such as static charge and heat. Embodiments of the present disclosure provide an integrated antenna assembly that is able to dissipate static charge that builds thereon during flight of an aircraft, for example. Embodiments of the present disclosure provide an integrated antenna assembly that is able to effectively and evenly distribute and dissipate heat energy, such as may be generated by certain components, such as power amplifiers.

While various spatial and directional terms, such as top, bottom, lower, mid, lateral, horizontal, vertical, front and the like may be used to describe embodiments of the present disclosure, it is understood that such terms are merely used with respect to the orientations shown in the drawings. The orientations may be inverted, rotated, or otherwise changed, such that an upper portion is a lower portion, and vice versa, horizontal becomes vertical, and the like.

As used herein, a structure, limitation, or element that is "configured to" perform a task or operation is particularly structurally formed, constructed, or adapted in a manner corresponding to the task or operation. For purposes of clarity and the avoidance of doubt, an object that is merely capable of being modified to perform the task or operation is not "configured to" perform the task or operation as used herein.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the various embodiments of the disclosure without departing from their scope. While the dimensions and types of materials described herein are intended to define the parameters of the various embodiments of the disclosure, the embodiments are by no means limiting and are exemplary embodiments. Many other embodiments will be apparent to those of skill in the art upon reviewing the above description. The scope of the various embodiments of the disclosure should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, the terms "first," "second," and "third," etc. are used merely as labels, and are not intended to impose numerical requirements on their objects. Further, the limitations of the following claims are not written in means-plus-function format and are not intended to be interpreted based on 35 U.S.C. § 112(f), unless and until such claim limitations expressly use the phrase "means for" followed by a statement of function void of further structure.

This written description uses examples to disclose the various embodiments of the disclosure, including the best mode, and also to enable any person skilled in the art to practice the various embodiments of the disclosure, including making and using any devices or systems and performing any incorporated methods. The patentable scope of the various embodiments of the disclosure is defined by the claims, and may include other examples that occur to those skilled in the art. Such other examples are intended to be within the scope of the claims if the examples have structural elements that do not differ from the literal language of the claims, or if the examples include equivalent structural elements with insubstantial differences from the literal language of the claims.

What is claimed is:

1. An integrated antenna assembly, comprising:
   a substrate including a first dielectric, a second dielectric separated from the first dielectric, and a ground plane on a backside;
   one or more antenna elements disposed on the first dielectric;

one or more electronics components on or within the substrate;

a microstrip feed network disposed on the second dielectric, wherein the microstrip feed network electrically connects the one or more antenna elements to the one or more electronic components; and a static discharge element extending from the microstrip feed network and disposed between the one or more antenna elements and the one or more electronics components.

2. The integrated antenna assembly of claim 1, further comprising a via that electrically connects the static discharge element to the ground plane.

3. The integrated antenna assembly of claim 1, wherein the static discharge element is a quarter-wave shorted stub with a length of a quarter wavelength of an operating frequency of the integrated antenna assembly.

4. The integrated antenna assembly of claim 1, further comprising one or more thermal dissipators.

5. The integrated antenna assembly of claim 4, wherein the one or more thermal dissipators are disposed within the composite substrate.

6. The integrated antenna assembly of claim 4, wherein the one or more thermal dissipators are thermally-conductive films.

7. The integrated antenna assembly of claim 4, wherein the one or more thermal dissipators are formed of one or more of graphite, graphene, alumina, silicon carbide, or aluminum nitride.

8. The integrated antenna assembly of claim 4, wherein each of the one or more thermal dissipators is sandwiched between two additional ground planes.

9. The integrated antenna assembly of claim 8, wherein one or both of the two additional ground planes electrically connect to the ground plane through one or more vias.

10. The integrated antenna assembly of claim 1, wherein the static discharge element comprises a first trace that electrically connects to a second trace of the microstrip feed network that electrically connects the one or more antenna elements to the one or more electronics components.

11. The integrated antenna assembly of claim 1, wherein the substrate is a composite substrate.

12. An integrated antenna assembly, comprising:

a substrate including a first dielectric and a second dielectric separated from the first dielectric;

one or more antenna elements disposed on the first dielectric;

one or more electronics components disposed on or within the substrate;

a microstrip feed network electrically connecting the one or more antenna elements to the one or more electronic components;

a static discharge element extending from the microstrip feed network and disposed between the one or more antenna elements and the one or more electronics components; and one or more thermal dissipators sandwiched between two ground planes.

13. The integrated antenna assembly of claim 12, wherein the microstrip feed network is disposed on the second dielectric that is separated from the first dielectric.

14. The integrated antenna assembly of claim 12, wherein the one or more thermal dissipators are disposed within the substrate.

15. The integrated antenna assembly of claim 14, wherein the substrate comprises a ground plane on a backside.

16. The integrated antenna assembly of claim 12, wherein the one or more thermal dissipators are thermally-conductive films.

17. The integrated antenna assembly of claim 12, wherein the one or more thermal dissipators are formed of one or more of graphite, graphene, alumina, silicon carbide, or aluminum nitride.

18. The integrated antenna assembly of claim 12, wherein one or both of the two ground planes electrically connect to at least one other ground plane through one or more vias.

19. The integrated antenna assembly of claim 12, wherein the one or more thermal dissipators extend over an entire length and an entire width of the substrate.

20. The integrated antenna assembly of claim 12, wherein the substrate is a composite substrate.

21. An integrated antenna assembly, comprising:

a composite substrate including a first dielectric, a second dielectric separated from the first dielectric, and a ground plane on a backside;

one or more antenna elements disposed on the first dielectric;

one or more electronics components disposed on or within the composite substrate;

a microstrip feed network disposed on the second dielectric, wherein the microstrip feed network couples the one or more antenna elements to the one or more electronic components;

a static discharge element extending from the microstrip feed network and disposed between the one or more antenna elements and the one or more electronics components;

a first via that connects the static discharge element to the ground plane; and one or more thermal dissipators disposed within the composite substrate, wherein each of the one or more thermal dissipators is sandwiched between two additional ground planes; and one or more second vias, wherein one or both of the two additional ground planes connect to the ground plane through the one or more second vias.

22. The integrated antenna assembly of claim 21, wherein the static discharge element comprises a first trace that electrically connects to a second trace of the microstrip feed network that electrically connects the one or more antenna elements to the one or more electronics components.

23. The integrated antenna assembly of claim 21, wherein the static discharge element connects to the second trace at a right angle.

* * * * *